(12) United States Patent
Kugler et al.

(10) Patent No.: US 7,986,472 B2
(45) Date of Patent: Jul. 26, 2011

(54) OPTICAL ELEMENT MODULE

(75) Inventors: Jens Kugler, Heubach (DE); Ulrich Weber, Ulm (DE); Bernhard Gellrich, Aalen (DE); Yim-Bun Patrick Kwan, Aalen (DE); Peter Deufel, Aalen (DE)

(73) Assignee: Carl Zeiss SMT, AG., Oberkochen (DE)

(*) Notice: Subject to any disclaimer, the term of this patent is extended or adjusted under 35 U.S.C. 154(b) by 1052 days.

(21) Appl. No.: 11/444,191

(22) Filed: May 31, 2006

(65) Prior Publication Data
US 2007/0146906 A1    Jun. 28, 2007

Related U.S. Application Data

(60) Provisional application No. 60/685,864, filed on May 31, 2005.

(51) Int. Cl.
*G02B 7/02* (2006.01)
(52) U.S. Cl. ........................................ 359/820
(58) Field of Classification Search .......... 359/649–651, 359/819–820
See application file for complete search history.

(56) References Cited

U.S. PATENT DOCUMENTS

| | | | |
|---|---|---|---|
| 5,177,641 A * | 1/1993 | Kobayashi et al. | 359/820 |
| 6,621,557 B2 * | 9/2003 | Takahashi | 355/67 |
| 7,265,917 B2 * | 9/2007 | Kugler et al. | 359/813 |
| 2001/0039126 A1 | 11/2001 | Ebinuma | 438/795 |
| 2002/0071190 A1 * | 6/2002 | Wada et al. | 359/819 |
| 2003/0066764 A1 * | 4/2003 | Scherer et al. | 206/5.1 |
| 2003/0151728 A1 * | 8/2003 | Nishi | 355/30 |
| 2005/0225737 A1 * | 10/2005 | Weissenrieder et al. | 355/53 |
| 2007/0201151 A1 * | 8/2007 | Schletterer et al. | 359/819 |

* cited by examiner

*Primary Examiner* — Ricky L Mack
*Assistant Examiner* — Vipin M Patel
(74) *Attorney, Agent, or Firm* — Ohlandt, Greeley, Ruggiero & Perle, L.L.P.

(57) ABSTRACT

There is provided an optical element module comprising a first optical element and an optical element holder. The first optical element has a first coefficient of thermal expansion. The optical element holder holds the first optical element and has a second coefficient of thermal expansion, the second coefficient of thermal expansion being adapted to the first coefficient of thermal expansion. The optical element is directly contacting the optical element holder in a wide contact area. The contact area is defined by a first contact surface of the first optical element and a second contact surface of the optical element holder, wherein the second contact surface matches the first contact surface. Thus, favorable rigidity and deformation behavior is provided.

38 Claims, 6 Drawing Sheets

OPTICAL ELEMENT MODULE

CROSS-REFERENCE TO RELATED APPLICATIONS

The present application is claiming priority of U.S. Provisional Patent Application No. 60/685,864, filed May 31, 2005, the content of which is herein incorporated by reference.

BACKGROUND OF THE INVENTION

The invention relates to optical element modules used in exposure processes, in particular to optical element modules of microlithography systems. It further relates to optical element units comprising such optical element modules. It also relates to optical exposure apparatuses comprising such optical element units. Furthermore, it relates to a method of holding an optical element as well as a method of manufacturing such optical element modules. The invention may be used in the context of photolithography processes for fabricating microelectronic devices, in particular semiconductor devices, or in the context of fabricating devices, such as masks or reticles, used during such photolithography processes.

Typically, the optical systems used in the context of fabricating microelectronic devices such as semiconductor devices comprise a plurality of optical elements, such as lenses and mirrors etc., in the light path of the optical system. Those optical elements usually cooperate in an exposure process to transfer an image formed on a mask, reticle or the like onto a substrate such as a wafer. Said optical elements are usually combined in one or more functionally distinct optical element groups. These distinct optical element groups may be held by distinct optical element units. Such optical element units are often built from a stack of optical element modules holding one or more optical elements. These optical element modules usually comprise an external generally ring shaped support device supporting one or more optical element holders each, in turn, holding an optical element.

Optical element groups comprising at least mainly refractive optical elements, such as lenses, mostly have a straight common axis of symmetry of the optical elements usually referred to as the optical axis. Moreover, the optical element units holding such optical element groups often have an elongated substantially tubular design due to which they are typically referred to as lens barrels.

Due to the ongoing miniaturization of semiconductor devices there is a permanent need for enhanced resolution of the optical systems used for fabricating those semiconductor devices. This need for enhanced resolution obviously pushes the need for an increased numerical aperture and increased imaging accuracy of the optical system.

Furthermore, to reliably obtain high-quality semiconductor devices it is not only necessary to provide an optical system showing a high degree of imaging accuracy. It is also necessary to maintain such a high degree of accuracy throughout the entire exposure process and over the lifetime of the system. As a consequence, the optical elements of such an optical system must be supported in a defined manner in order to maintain a predetermined spatial relationship between said optical elements to provide a high quality exposure process.

In this context there exist, among others, two general requirements for the support of optical elements of the optical system. One is that the rigidity of the support system of the optical elements has to be as high as possible in certain directions, in particular in the direction of the optical axis, to keep the resonant frequencies of the system as high as possible. Furthermore, deformations of the optical elements of the optical system are to be avoided to the greatest possible extent in order to keep imaging errors resulting from such deformations as low as possible.

To avoid thermally induced deformations of an optical element due to differences in the coefficient of thermal expansion of the optical element and its optical element holder, it is known to connect the optical element and its optical element holder via deformation uncoupling elements. These deformation uncoupling elements generally allow for relative movements between the optical element and its optical element holder.

These deformation uncoupling elements may provide a reduction of the stresses and, thus, the deformations introduced into the optical element. However, they have the disadvantage that they also reduce the rigidity of the support system. To deal with this effect, the rigidity of the uncoupling elements might be increased, but this would reduce their deformation uncoupling abilities leading to increased stresses and, thus, the deformations introduced into the optical element.

Furthermore, it is known from US 2001/0039126 A1 (to Ebinuma et al.) to provide for an adaptation of the coefficients of thermal expansion (CTE) between an optical element and a support ring contacting the optical element via three small contact pins and/or layers of adhesive material in order to reduce the introduction of thermally induced deformations into the optical element resulting from differences in the coefficients of thermal expansion. However, the small contact pins as well as the layers of adhesive are likely not to provide for a desirable long term stable and rigid connection between the optical element and the support structure.

A further problem that arises with the three point support disclosed in this document is the wave like deformation introduced into the optical element due to the local concentration of the reaction forces to the gravitational forces acting on the optical element.

SUMMARY OF THE INVENTION

It is thus an object of the invention to, at least to some extent, overcome the above disadvantages and to provide good and long term reliable imaging properties of an optical system used in an exposure process.

It is a further object of the invention to increase imaging accuracy of an optical system used in an exposure process by increasing the rigidity of the support mechanism for an optical element of the optical system.

It is a further object of the invention to increase imaging accuracy of an optical system used in an exposure process by reducing the deformations introduced into an optical element of the optical system via its support structure.

These objects are achieved according to the invention which is based on the teaching that a reduction in the deformations introduced into an optical element of the optical system via its support structure and an increase in the rigidity of the support mechanism for the optical element may be achieved when an optical element is directly contacting its associated optical element holder in a wide contact area, wherein the coefficient of thermal expansion of the optical element holder is adapted to the coefficient of thermal expansion of the optical element and wherein the contact area is defined by a first contact surface of the optical element and a second contact surface of the optical element holder matching the first contact surface.

With this configuration, the direct connection between the optical element and the optical element holder in a wide contact area provides for a maximum rigidity at the interface between the optical element and the optical element holder. In particular, the rigidity at the interface is high in a direction perpendicular to the contact area. The mutual adaptation of the coefficients of thermal expansion, in turn, allows for such a direct connection without the risk of an excessive introduction of stresses into said interface and the optical element which would otherwise occur with such large contact areas due to differences in the thermal expansion behavior of the coupled parts.

It should be noted that the term "wide contact area", in the sense of the present invention is to be understood as defining a wide contact area having a considerable extension in two perpendicular directions. Such a wide contact area considerably exceeds the contact areas provided when the optical element is contacted in a so called point contact, e.g. via small contact pins as it is disclosed in the above US 2001/0039126 A1 (to Ebinuma et al.), or in a so called line contact, e.g. via contact edges contacting the optical element. Preferably, the contact area corresponds to at least 2% of an adjacent optical surface of the optical element. In further preferred embodiments, the wide contact area has a circumferential extension over an angle of at least 10° in a circumferential direction of the optical element in question. In further preferred embodiments, the wide contact area has a radial extension over at least 2% of the radial extension of the optical element in this radial direction.

A further advantage of the direct connection between the optical element an the optical element holder lies within the fact that the interface between the optical element an the optical element holder is or may be easily sealed. Thus, the advantages of the invention come to their full effect in applications where, in addition to the improved rigidity and deformation behavior, fluid tightness properties play an important role. Such applications may be so called immersion applications as they play an increasingly important role in photolithography processes for fabricating microelectronic devices. Here, typically, the last optical element of the optical system adjacent to the wafer and the part of the wafer to be currently worked on are immersed in an immersion fluid to achieve a numerical aperture NA>1.

Thus, according to a first aspect of the invention there is provided an optical element module comprising a first optical element and an optical element holder. The first optical element has a first coefficient of thermal expansion. The optical element holder holds the first optical element and has a second coefficient of thermal expansion, the second coefficient of thermal expansion being adapted to the first coefficient of thermal expansion. The optical element is directly contacting the optical element holder in a wide contact area. The contact area is defined by a first contact surface of the first optical element and a second contact surface of the optical element holder, wherein the second contact surface matches the first contact surface.

According to a second aspect of the invention there is provided an optical element unit comprising a plurality of optical element modules connected to each other and supporting a plurality of optical elements. The plurality of optical element modules comprises a first optical element module being an optical element module according to the invention.

According to a third aspect of the invention there is provided an optical exposure apparatus for transferring an image of a pattern formed on a mask onto a substrate comprising a light path, a mask location located within the light path and receiving the mask, a substrate location located at an end of the light path and receiving the substrate and an optical element unit according to the invention located within the light path between the mask location and the and the substrate location.

According to a fourth aspect of the invention there is provided a method of holding an optical element comprising providing an optical element having a first coefficient of thermal expansion, providing an optical element holder having a second coefficient of thermal expansion, the second coefficient of thermal expansion being adapted to the first coefficient of thermal expansion, connecting the optical element directly to the optical element holder at a first location via a wide contact area, the contact area being defined by a first contact surface of the optical element and a second contact surface of the optical element holder, the second contact surface matching the first contact surface, and holding the optical element via the optical element holder.

According to a fifth aspect of the invention there is provided a method of manufacturing an optical element unit, the optical element unit comprising at least one optical element, wherein the optical element is held using the method of holding an optical element according to the invention.

Further aspects and embodiments of the invention will become apparent from the dependent claims and the following description of preferred embodiments which refers to the appended figures. All combinations of the features disclosed, whether explicitly recited in the claims or not, are within the scope of the invention.

DETAILED DESCRIPTION OF THE INVENTION

First Embodiment

Figure 1:
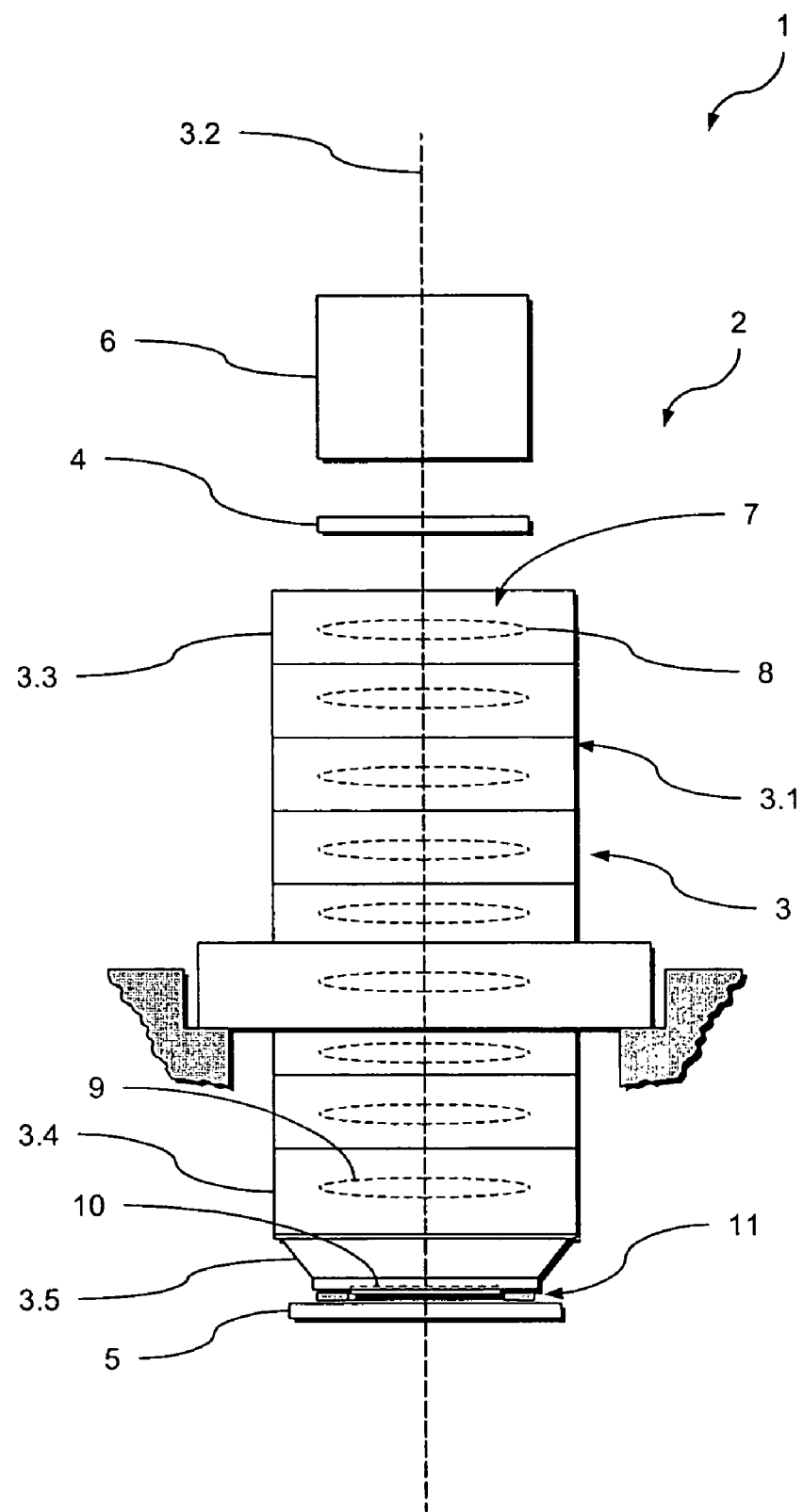
FIG. 1 is a schematic representation of a preferred embodiment of an optical exposure apparatus according to the invention comprising a preferred embodiment of an optical element unit and an optical element module according to the invention.

In the following, a first preferred embodiment of an optical exposure apparatus 1 according to the invention comprising an optical projection system 2 with an optical element unit 3 according to the invention will be described with reference to FIGS. 1 and 2.

The optical exposure apparatus 1 is adapted to transfer an image of a pattern formed on a mask 4 onto a substrate 5. To this end, the optical exposure apparatus 1 comprises an illumination system 6 illuminating said mask 4 and the optical element unit 3. The optical element unit 3 projects the image of the pattern formed on the mask 4 onto the substrate 5, e.g. a wafer or the like.

To this end, the optical element unit 3 holds an optical element group 7. This optical element group 7 is held within a housing 3.1 of the optical element unit 3. The optical element group 7 comprises a number of optical elements 8 and optical elements 9 and 10 such as lenses, mirrors or the like. These optical elements 8 to 10 are aligned along an optical axis 3.2 of the optical element unit 3.

The optical projection system 2 receives the part of the light path between the mask 4 and the substrate 5. Its optical elements 8 cooperate to transfer the image of the pattern formed on the mask 4 onto the substrate 5 located at the end of the light path. To increase the numerical aperture NA of the optical projection system 2, the optical projection system 2 comprises an immersion zone 11 located between the lower end of the optical element unit 3 and the substrate 5.

Figure 2:
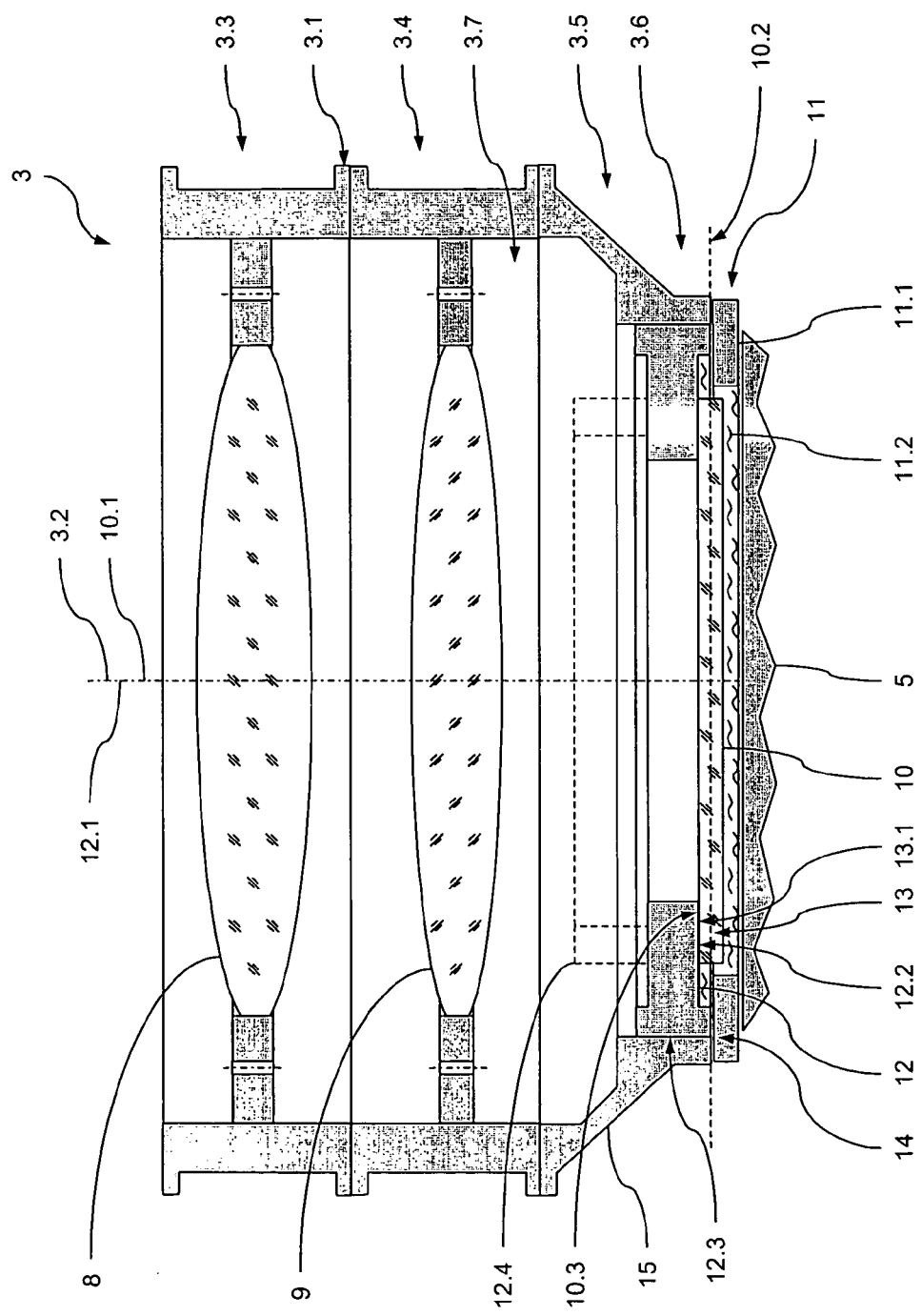
FIG. 2 is a schematic sectional representation of a part of the optical element unit of the optical exposure apparatus of FIG. 1.

As may be seen from FIG. 2, the immersion zone 11 is mainly defined by the optical element 10, the substrate 5 and an immersion zone frame 11.1 located there between. The immersion zone 11 is filled with an immersion medium 11.2 such as highly purified water.

The optical element unit 3 is composed of a plurality of optical element modules 3.3 and optical element modules 3.4 and 3.5 stacked and tightly connected to form the optical element unit 3. Each optical element module 3.3 to 3.5 holds one or more of the optical elements 8, 9, 10, respectively.

FIG. 2 shows a schematic sectional representation of the last three optical element modules 3.3, 3.4 and 3.5 of the optical element unit 3. As can be seen from FIG. 2, the optical element 8 of the optical element module 3.3 and the penultimate optical element 9 of the penultimate optical element module 3.4 are rotationally symmetric lenses held by corresponding lens holders. The last optical element module 3.5 forming the exit end 3.6 of the optical element unit 3 comprises an ultimate optical element in the form of a plane parallel plate 10 and an optical element holder 12 holding the plane parallel plate 10.

The plane parallel plate 10 is rotationally symmetric having a first axis of symmetry 10.1 essentially coinciding with the optical axis 3.2 of the optical element unit 3. The plate 10 mainly extends in a first plane 10.2 perpendicular to said first axis of symmetry 10.1.

The optical element holder is formed by a ring shaped frame element 12 having a second axis of symmetry 12.1, which—in the situation shown in FIG. 2—essentially coincides with the first axis of symmetry 10.1 of the plate 10. The frame element 12 extends in a circumferential direction of the plate 10 in a second plane perpendicular to said second axis of symmetry 12.1 and parallel to said first plane 10.2.

The plate 10 is connected directly to the frame element 12 at a first location 13 in a wide contact area 13.1. To this end, the plate has a planar and ring shaped first contact surface 10.3 connected, at the first location 13, to a first interface of the frame element 12 in the form of a planar and ring shaped second contact surface 12.2. Both, the first contact surface 10.3 and the second contact surface 12.2 are parallel to the first plane 10.2 of the plate 10. Thus, the second contact surface 12.2 matches the first contact surface 10.3 to provide a wide contact area 13.1.

The first contact surface 10.3 and the second contact surface 12.2 define the contact area 13.1. The contact area 13.1 extends over the entire circumference of the plate 10. Furthermore, the contact area 13.1 extends over about 20% of the radius of the plate 10, i.e. the dimension in a radial direction perpendicular to the first axis of symmetry 10.1 of the plate 10. Thus, a wide contact area 13.1 is formed, the area of which corresponds to about 38% of the area of the adjacent optical surface of the plate 10, the first contact surface 10.3 forms part of.

In this context, it will be appreciated that, with other embodiments of the invention, the first and second contact surface may be of any other shape. In particular, if the optical element is a lens or the like, the first and second contact surface may be matching curved surfaces, i.e. having substantially the same curvature at any point of the contact area.

With the direct connection between the plate 10 and frame element 12 and the wide contact area 13.1 there is provided a maximum rigidity at the first interface between the plate 10 and the frame element 12 in the direction of the optical axis 3.2. This leads to favorable vibration characteristics of the assembly.

It will be appreciated that the rigidity of the assembly formed by the plate 10 and the frame element 12 in the direction of the optical axis 3.2 may be enhanced according to the invention by mounting a stiffening element in the form of a hollow cylinder to the face of the frame element 12 facing away from the plate 10 as it is indicated by the dashed contour 12.4 in FIG. 2.

The plate 10 is adhesively connected to the frame element 12 over their entire contact area 13.1. To this end, a thin layer of suitable adhesive is applied to the first and second contact surface 10.3 and 12.2 before coupling the plate 10 to the frame element 12. Thus, a gas tight and liquid tight connection is formed between the plate 10 and the frame element 12.

This gas and liquid tight connection prevents the ingress of contaminants, such as liquid or gaseous fractions of the immersion medium etc., into the interior part 3.7 of the optical element unit 3 via the interface area between the plate 10 and the frame element 12. Such contaminants could deposit on the lenses and adversely affect the imaging properties of the optical element group 7.

The plate 10 is made of calcium fluoride ($CaF_2$), said calcium fluoride having a first coefficient of thermal expansion. The frame element 12, in turn, is made of stainless steel having a second coefficient of thermal expansion. The second coefficient of thermal expansion of the stainless steel used for the frame element 12 has been adapted to the first coefficient of thermal expansion of the plate 10.

This adaptation of the second coefficient of thermal expansion has been achieved by selecting a suitable fraction of manganese of said stainless steel material for the frame element 12 as a function of the first coefficient of thermal expansion of the calcium fluoride for the plate 10. In the embodiment shown, a stainless steel material X15NiMn20-6 (with C<0.20%, Si<1.00%, Mn=6.0 . . . 7.0%, Ni=19.0 . . . 21.0%) having the German material number 1.3932 (so called WKN number), namely a stainless steel material with a fraction of 6% of manganese and of 20% nickel is selected. However, it will be appreciated that, with other embodiments of the invention, a different fraction of manganese may be chosen. Preferably, the fraction of manganese is selected to be smaller than 8%. In particular, the fraction of manganese may be in the range from 6.0% to 7.0% and the fraction of nickel may be in the range from 19.0% to 21.0%. However, it will be appreciated that, with other embodiments of the invention, the adaptation of the second coefficient of thermal expansion may also be achieved by selecting a steel material with C<0.8%, Mn<8.0%, Ni<25.0% and Cr<20%. It will be further appreciated that this steel material does not have to be a stainless steel material. Furthermore, a fraction of Al<15.0% may be chosen as well. Furthermore, it should be noted in this context that all fractions cited above are fractions by mass.

In the embodiment shown, an adaptation of the second coefficient of thermal expansion to the first coefficient of thermal expansion is provided insofar as the second coefficient of thermal expansion is substantially equal to the first coefficient of thermal expansion. In particular, the difference between the first coefficient of thermal expansion and second coefficient of thermal expansion is less than $10^{-6}$ $K^{-1}$ over a temperature range from 20° C. to 26° C., i.e. the temperature range to be expected or kept, respectively, during operation of the optical exposure apparatus 1. Preferably, this difference is also kept within a temperature range from 5° C. to 40° C. which is the temperature range to be kept during transport, setup of and downtime of the optical exposure apparatus 1.

It will be appreciated that the difference between the first coefficient of thermal expansion and the second coefficient of thermal expansion being less than $10^{-6}$ $K^{-1}$ preferably applies for other materials and material pairings (e.g. quartz and invar) as well. Furthermore, preferably, the above temperature ranges apply for these other materials and material pairings as well.

In this context it is to be mentioned that, in the embodiment shown, a temperature profile within the optical element module 3.5 is to be expected during normal operation which does not show particularly strong temperature gradients at the transition between the plate 10 and the frame element 12.

However, it will be appreciated that, with other embodiments of the invention, with strong temperature gradients at the transition between the optical element 10 and the optical element holder the second coefficient of thermal expansion may be selected to be different from the first coefficient of thermal expansion in order to account for these temperature gradients. Such high temperature gradients may exist, for example, due to cooling or heating effects of a gas flow or of the immersion medium in the environment of the optical element and its associated holder.

The above adaptation of the second coefficient of thermal expansion to the first coefficient of thermal expansion provides for matching thermal expansion properties at the interface area between the plate 10 and the frame element 12. It makes it possible to have the direct adhesive connection between the plate 10 and the frame element 12 without the risk of any harm to the connection by relative movements between the plate 10 and the frame element 12 due to different thermal expansion properties.

At a second location 14, remote from the first location 13, the frame element 12 is connected via a second interface 12.3 in a fluid tight manner to a support element in the form of a housing module 15 of the last optical element module 3.5. The frame element 12 may be connected to the housing module 15 in any suitable manner. For example, the frame element 12 may be connected to the housing module by screws, bolts, clamping elements etc. or combinations thereof. Preferably, the use of an organic adhesive is avoided to avoid the adverse effects (such as ageing, outgassing etc.) that may be associated to such an organic adhesive.

The second location 14 is located at a first distance from the first location 13 which is sufficiently large such that stresses introduced into the frame element 12 at the second location 14 are taken and substantially relieved within the frame element 12 such that, if any, only a small amount of such stresses is introduced into the plate 10 at the first location 13. Thus, the stresses introduced into the plate 10 and, thus, deformations of the plate 10 resulting from such stresses are reduced with the invention.

The necessary distance between the first and second location in order to achieve the above stress relief depends on the material and the geometry of the frame element. Thus, in turn, at given spatial boundaries, the geometry of the frame element may be selected as a function of the stress relief to be achieved.

Although the material of the housing module 15 might also be the same as the material of the frame element 12, in the embodiment shown, the material of the housing module 15 is a steel material different form the steel material used for the frame element 12. In particular, the material of the housing module 15 has a third coefficient of thermal expansion which is different from the second coefficient of thermal expansion. Thus, at the interface between the housing module 15 and the frame element 12, considerable stresses may occur due to these different coefficients of thermal expansion. However, the steel materials used for both components are of sufficient strength to take these stresses.

The components of the penultimate optical element module 3.4, apart from the penultimate lens 9, are made of the same material as the housing module 15, Thus, as a consequence of the different coefficients of thermal expansion within the last optical element module 3.5 and the stresses resulting therefrom, relative motion between the last optical element module and the penultimate optical element module 3.4 might occur at their interface. To avoid such relative motion, a sufficiently strong connection between the penultimate optical element module 3.4 and the last optical element module 3.5 is provided.

In the following, a preferred embodiment of a method of manufacturing the optical element unit 3 of FIG. 1 including a preferred embodiment of a method of holding an optical element according to the present invention will be described with reference to FIGS. 1 to 3.

Figure 3:
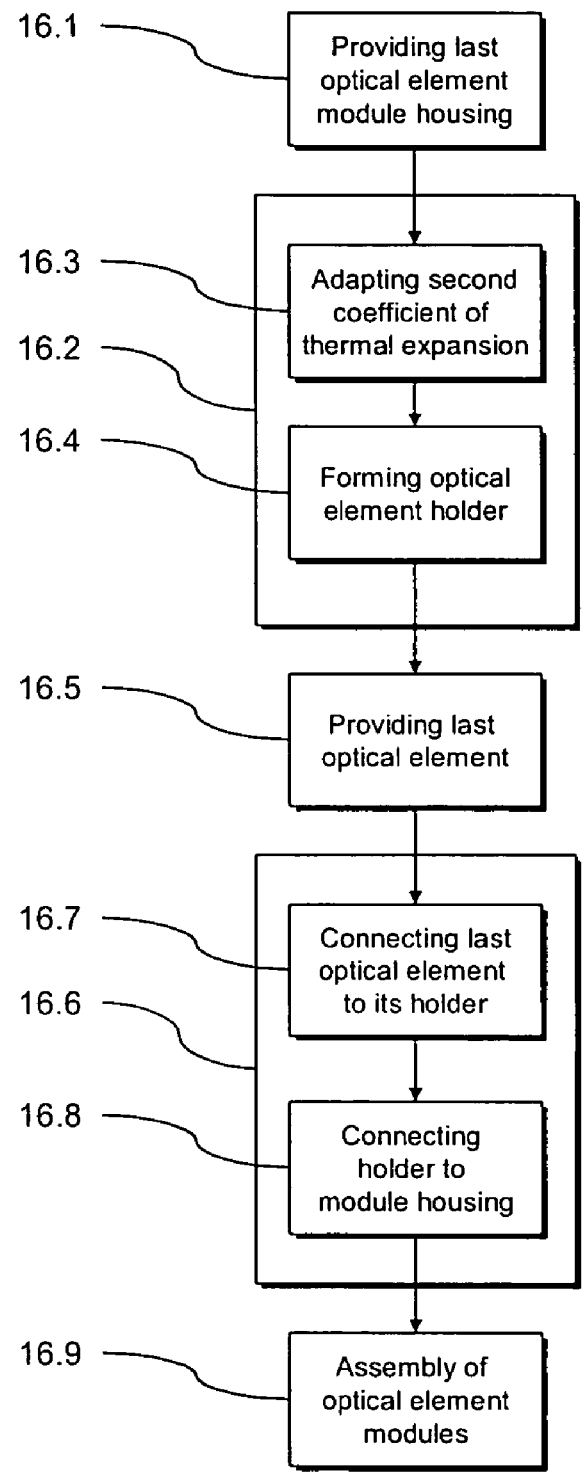
FIG. 3 is a block diagram of a preferred embodiment of a method of manufacturing the optical element unit of FIG. 1 including a preferred embodiment of a method of holding an optical element according to the invention.

FIG. 3 shows a block diagram of a preferred embodiment of a method of manufacturing the optical element unit 3 of FIG. 1 including a preferred embodiment of a method of holding an optical element according to the invention.

In a first step 16.1, the housing module 15 of the last optical element module 3.5 is provided providing a part of the housing 3.1 as it has been described above in the context of FIGS. 1 and 2.

In a second step 16.2, the frame element 12 is provided. To this end, in a first partial step 16.3 the coefficient of thermal expansion of the steel material to be used for the frame element 12 is adapted to the first coefficient of thermal expansion as it has been described above in the context of FIGS. 1 and 2. In a second partial step 16.4 the adapted steel material is used for manufacturing the frame element 12.

In a third step 16.5, the plate 10 is provided with the first contact surface 10.3 as it has been described above in the context of FIGS. 1 and 2.

In a fourth step 16.6, the plate 10 is held within the housing of the last optical element module 3.5 as it has been described above in the context of FIGS. 1 and 2. To this end, in a third partial step 16.7, the plate 10 is connected in a fluid tight manner to the frame element 12. Furthermore, in a fourth partial step 16.8, the frame element 12 with the plate 10 is connected in a fluid tight manner to the housing module 15 of the last optical element module 3.5 to provide a configuration as it has been described above in the context of FIGS. 1 and 2.

Finally, in a fifth step 16.9, the other optical element modules 3.3 to 3.4 are provided and the optical element modules 3.3 to 3.5 are assembled to form the optical element unit 3 in order to provide a configuration as it has been described above in the context of FIGS. 1 to 3.

It will be appreciated that the steps 16.1 to 16.8 form part of a preferred embodiment of a method of holding an optical element according to the invention. Furthermore, it will be appreciated that, with other embodiments of the present invention, the above steps may be executed in any suitable different order to achieve the configuration as it has been described above in the context of FIGS. 1 and 2.

Second Embodiment

In the following, a second preferred embodiment of an optical element module 103.5 according to the invention will be described with reference to FIGS. 1 and 4. In this embodiment, the optical element module 103.5 replaces the optical element module 3.5 within the exposure apparatus 1 of FIG. 1.

Figure 4:
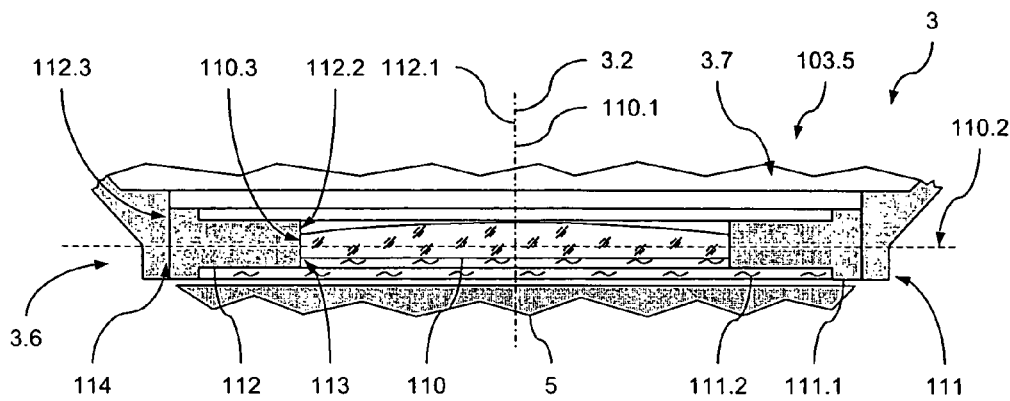
FIG. 4 is a schematic partial sectional representation of a further preferred embodiment of an optical element module according to the invention used in the optical exposure apparatus of FIG. 1.

FIG. 4 shows a schematic sectional representation of the last optical element module 103.5 of the optical element unit 3. As can be seen from FIG. 4, the last optical element module 103.5 forming the exit end 3.6 of the optical element unit 3 comprises an ultimate optical element in the form of a lens 110 and an optical element holder 112 holding the lens 110.

The lens 110 is rotationally symmetric having a first axis of symmetry 110.1 essentially coinciding with the optical axis 3.2 of the optical element unit 3. The lens 110 mainly extends in a first plane 110.2 perpendicular to said first axis of symmetry 110.1.

The optical element holder is formed by a ring shaped frame element 112 having a second axis of symmetry 112.1, which—in the situation shown in FIG. 4—essentially coincides with the first axis of symmetry 110.1 of the lens 110. The frame element 112 extends in a circumferential direction of the lens 110 in a second plane perpendicular to said second axis of symmetry 112.1 and parallel to said first plane 110.2.

In this embodiment, as may be seen from FIG. 4, the immersion zone 111 is mainly defied by the optical element 110, the substrate 5 and an immersion zone frame 111.1 formed by a lower part of the frame element 112. The immersion zone 111 is filled with an immersion medium 111.2 such as highly purified water.

The lens 110 is connected directly to the frame element 112 at a first location 113. To this end, the lens has a cylindrical first contact surface 110.3 connected, at a first location, to a first interface of the frame element 112 in the form of a cylindrical second contact surface 112.2. Both, the first contact surface 110.3 and the second contact surface 112.2 are parallel to the axis of symmetry 110.1 of the lens 110. Thus, the second contact surface 112.2 matches the first contact surface 110.3 to provide a wide contact area 113.1.

The first contact surface 110.3 and the second contact surface 112.2 define the contact area 113.1. The contact area 113.1 extends over the entire circumference of the lens 110. Thus, a wide contact area 113.1 is formed, the area of which corresponds to about 21% of the area of the adjacent plane optical surface of the lens 110.

In this context, it will be appreciated that, with other embodiments of the invention, the first and second contact surface may be of any other shape. In particular, if the optical element is a lens or the like, the first and second contact surface may be matching curved surfaces.

With the direct connection between the plate 110 and the frame element 112 and the wide contact surface 113.1 there is provided a maximum rigidity at the first interface between the plate 110 and the frame element 112 in the direction of the optical axis 3.2. This leads to favorable vibration characteristics of the assembly.

The lens 110 is soldered to the frame element 112 over their entire contact area. To this end, a suitable solder is applied to the first and second contact surface 110.3 and 112.2 when coupling the lens 110 to the frame element 112. Thus, a gas tight and liquid tight connection is formed between the lens 110 and the frame element 112.

This gas and liquid tight connection prevents the ingress of contaminants, such as liquid or gaseous fractions of the immersion medium etc., into the interior part 3.7 of the optical element unit 3 via the interface area between the lens 110 and the frame element 112. Such contaminants could deposit on the lenses and adversely affect the imaging properties of the optical element group 7.

The lens 110 is made of quartz ($SiO_2$), said quartz having a first coefficient of thermal expansion. The frame element 112, in turn, is made of Invar having a second coefficient of thermal expansion. The second coefficient of thermal expansion of the Invar material used for the frame element 112 is adapted to the first coefficient of thermal expansion of the lens 110.

This provides for matching thermal expansion properties at the interface area between the lens 110 and the frame element 112. It makes it possible to have the direct soldered connection between the lens 110 and the frame element 112 without the risk of any harm to the connection by relative movements between the lens 110 and the frame element 112 due to different thermal expansion properties.

At a second location 114, remote from the first location 113, the frame element 112 is connected via a second interface 112.3 in a fluid tight manner to a support element in the form of a housing module 115 of the last optical element module 103.5. The frame element 112 may be connected to the housing module 115 in any suitable manner. For example, the frame element 112 may be connected to the housing module by screws, bolts, clamping elements etc. or combinations thereof.

The second location 114 is located at a first distance from the first location 113 which is sufficiently large such that stresses introduced into the frame element 112 at the second location 114 are taken and substantially relieved within the frame element 112 such that, if any, only a small amount of such stresses is introduced into the lens 110 at the first location 113. Thus, the stresses introduced into the lens 110 and, thus, deformations of the lens 110 resulting from such stresses are reduced with the invention.

The necessary distance between the first and second location in order to achieve the above stress relief depends on the material and the geometry of the frame element. Thus, in turn, at given spatial boundaries, the geometry of the frame element may be selected as a function of the stress relief to be achieved.

Although the material of the housing module 115 might also be the same as the material of the frame element 112, in the embodiment shown, the material of the housing module 115 is a steel material. In particular, the material of the housing module 115 has a third coefficient of thermal expansion which is different from the second coefficient of thermal expansion. Thus, at the interface between the housing module 115 and the frame element 112, considerable stresses may occur due to these different coefficients of thermal expansion. However, the materials used for both components are of sufficient strength to take these stresses.

The components of the penultimate optical element module 3.4, apart from the penultimate lens 9, are made of the same material as the housing module 115, Thus, as a consequence of the different coefficients of thermal expansion within the last optical element module 103.5 and the stresses resulting therefrom, relative motion between the last optical element module 103.5 and the penultimate optical element module 3.4 might occur at their interface. To avoid such relative motion, a sufficiently strong connection between the penultimate optical element module 3.4 and the last optical element module 103.5 is provided.

It will be appreciated that the optical element unit 103 of FIG. 4 may be manufactured with a method according to the invention similar to the one that has been described above with reference to FIG. 3.

Third Embodiment

In the following, a third preferred embodiment of an optical element module 203.5 according to the invention will be described with reference to FIGS. 1 and 5. In this embodiment, the optical element module 203.5 replaces the optical element module 3.5 within the exposure apparatus 1 of FIG. 1.

Figure 5:
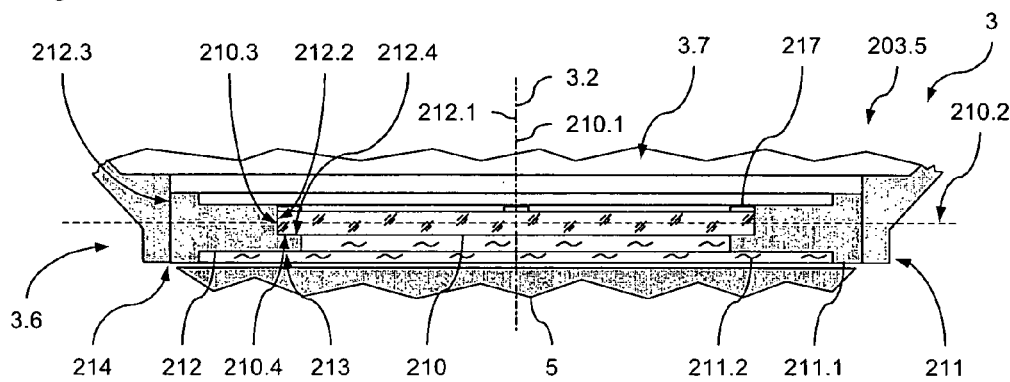
FIG. 5 is a schematic partial sectional representation of a further preferred embodiment of an optical element module according to the invention used in the optical exposure apparatus of FIG. 1.

FIG. 5 shows a schematic sectional representation of the last optical element module 203.5 of the optical element unit 3. As can be seen from FIG. 5, the last optical element module 203.5 forming the exit end 3.6 of the optical element unit 3 comprises an ultimate optical element in the form of a plane parallel plate 210 and an optical element holder 212 holding the plane parallel plate 210.

The plane parallel plate 210 is rotationally symmetric having a first axis of symmetry 210.1 essentially coinciding with the optical axis 3.2 of the optical element unit 3. The plate 210 mainly extends in a first plane 210.2 perpendicular to said first axis of symmetry 210.1.

The optical element holder is formed by a ring shaped frame element 212 having a second axis of symmetry 212.1, which—in the situation shown in FIG. 5—essentially coincides with the first axis of symmetry 210.1 of the plate 210. The frame element 212 extends in a circumferential direction of the plate 210 in a second plane perpendicular to said second axis of symmetry 212.1 and parallel to said first plane 210.2.

In this embodiment, as may be seen from FIG. 5, the immersion zone 211 is mainly defined by the optical element 210, the substrate 5 and an immersion zone frame 211.1 formed by a lower part of the frame element 212. The immersion zone 211 is filled with an immersion medium 211.2 such as highly purified water.

The plate 210 is connected directly to the frame element 212 at a first location 213. To this end, the plate has a cylindrical first contact surface 210.3 connected, at a first location, to a first interface of the frame element 212 in the form of a cylindrical second contact surface 212.2. Both, the first contact surface 210.3 and the second contact surface 212.2 are parallel to the axis of symmetry 210.1 of the plate 210. Furthermore, the plate 210 has a planar and ring shaped third contact surface 210.4 connected, at said first location 213, to a planar and ring shaped fourth contact surface 212.5. Both, the third contact surface 210.4 and the fourth contact surface 212.5 are parallel to the first plane 210.2 of the plate 210. Thus, the second contact surface 112.2 matches the first contact surface 110.3 and the third contact surface 210.4 matches the fourth contact surface 212.5 to provide a wide contact area 113.1.

The first contact surface 110.3 and the second contact surface 112.2 as well as the third contact surface 210.4 and the fourth contact surface 212.5 define the contact area 213.1. The contact area 213.1 extends over the entire circumference of the plate 210. Thus, a wide contact area 213.1 is formed, the area of which corresponds to about 40% of the area of the adjacent optical surface of the plate 210.

In this context, it will be appreciated that, with other embodiments of the invention, the first to fourth contact surface may be of any other shape. In particular, if the optical element is a lens or the like, the first to fourth contact surface may be matching curved surfaces, respectively.

With the direct connection between the plate 210 and the frame element 212 and the wide contact area 213.1 there is provided a maximum rigidity at the first interface between the plate 210 and the frame element 212 in the direction of the optical axis 3.2. This leads to favorable vibration characteristics of the assembly.

The plate 210 is clamped to the frame element 212 via clamping elements 217 connected to the frame element 212 and acting upon the plate 210 in the direction of the optical axis 3.2. Furthermore, a thin layer of a sealing material is applied to the first to fourth contact surface 210.3, 212.2 and 210.4, 212.5, respectively, when coupling the plate 210 to the frame element 212. Thus, a gas tight and liquid tight connection is formed between the plate 210 and the frame element 212.

This gas and liquid tight connection prevents the ingress of contaminants, such as liquid or gaseous fractions of the immersion medium etc., into the interior part 3.7 of the optical element unit 3 via the interface area between the plate 210 and the frame element 212. Such contaminants could deposit on the lenses and adversely affect the imaging properties of the optical element group 7.

The plate 210 is made of calcium fluoride ($CaF_2$), said calcium fluoride having a first coefficient of thermal expansion. The frame element 212, in turn, is made of a brass material having a second coefficient of thermal expansion. The second coefficient of thermal expansion of the brass material used for the frame element 212 is adapted to the first coefficient of thermal expansion of the plate 210 such as to be substantially equal to said first coefficient of thermal expansion.

This provides for matching thermal expansion properties at the interface area between the plate 210 and the frame element 212. It makes it possible to have the direct fluid tight connection between the plate 210 and the frame element 212 without the risk of any harm to the connection by relative movements between the plate 210 and the frame element 212 due to different thermal expansion properties.

At a second location 214, remote from the first location 213, the frame element 212 is connected via a second interface 212.3 in a fluid tight manner to a support element in the form of a housing module 215 of the last optical element module 203.5. The frame element 212 may be connected to the housing module 215 in any suitable manner. For example, the frame element 212 may be connected to the housing module by screws, bolts, clamping elements etc. or combinations thereof.

The second location 214 is located at a first distance from the first location 213 which is sufficiently large such that stresses introduced into the frame element 212 at the second location 214 are taken and substantially relieved within the frame element 212 such that, if any, only a small amount of such stresses is introduced into the plate 210 at the first location 213. Thus, the stresses introduced into the plate 210 and, thus, deformations of the plate 210 resulting from such stresses are reduced with the invention.

The necessary distance between the first and second location in order to achieve the above stress relief depends on the material and the geometry of the frame element. Thus, in turn, at given spatial boundaries, the geometry of the frame element may be selected as a function of the stress relief to be achieved.

Although the material of the housing module 215 might also be the same as the material of the frame element 212, in the embodiment shown, the material of the housing module 215 is a steel material. In particular, the material of the housing module 215 has a third coefficient of thermal expansion which is different from the second coefficient of thermal expansion. Thus, at the interface between the housing module 215 and the frame element 212, considerable stresses may occur due to these different coefficients of thermal expansion. However, the materials used for both components are of sufficient strength to take these stresses.

The components of the penultimate optical element module 3.4, apart from the penultimate lens 9, are made of the same material as the housing module 215, Thus, as a consequence of the different coefficients of thermal expansion within the last optical element module 203.5 and the stresses resulting therefrom, relative motion between the last optical element module 203.5 and the penultimate optical element module 3.4 might occur at their interface. To avoid such relative motion, a sufficiently strong connection between the penultimate optical element module 3.4 and the last optical element module 203.5 is provided.

It will be appreciated that the optical element unit 203 of FIG. 5 may be manufactured with a method according to the invention similar to the one that has been described above with reference to FIG. 3.

Fourth Embodiment

In the following, a fourth preferred embodiment of an optical element module 303.5 according to the invention will be described with reference to FIGS. 1 and 6. In this embodiment, the optical element module 303.5 replaces the optical element module 3.5 within the exposure apparatus 1 of FIG. 1.

Figure 6:
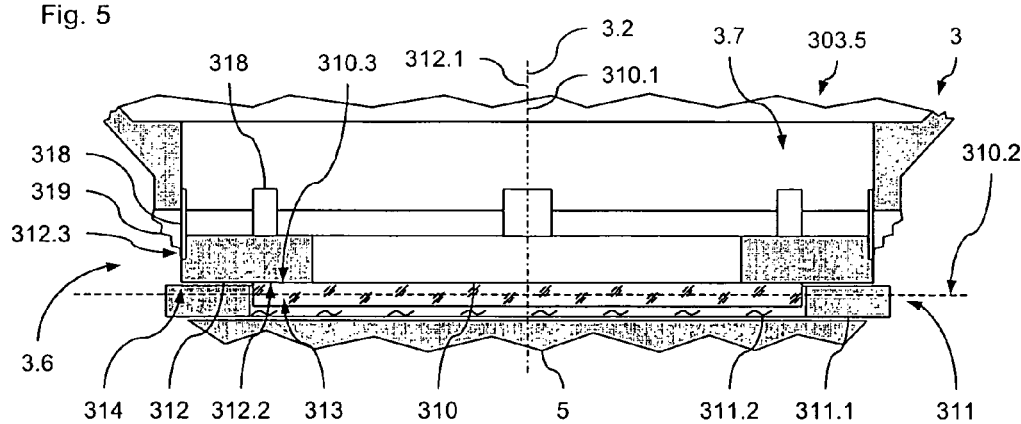
FIG. 6 is a schematic partial sectional representation of a further preferred embodiment of an optical element module according to the invention used in the optical exposure apparatus of FIG. 1.

FIG. 6 shows a schematic sectional representation of the last optical element module 303.5 of the optical element unit 3. As can be seen from FIG. 6, the last optical element module 303.5 forming the exit end 3.6 of the optical element unit 3 comprises an ultimate optical element in the form of a plane parallel plate 310 and an optical element holder 312 holding the plane parallel plate 310.

The plane parallel plate 310 is rotationally symmetric having a first axis of symmetry 310.1 essentially coinciding with the optical axis 3.2 of the optical element unit 3. The plate 310 mainly extends in a first plane 310.2 perpendicular to said first axis of symmetry 310.1.

The optical element holder is formed by a ring shaped frame element 312 having a second axis of symmetry 312.1, which—in the situation shown in FIG. 6—essentially coincides with the first axis of symmetry 310.1 of the plate 310. The frame element 312 extends in a circumferential direction of the plate 310 in a second plane perpendicular to said second axis of symmetry 312.1 and parallel to said first plane 310.2.

In this embodiment, as may be seen from FIG. 6, the immersion zone 311 is mainly defined by the optical element 310, the substrate 5 and an immersion zone frame 311.1. The immersion zone 311 is filled with an immersion medium 311.2 such as highly purified water.

The plate 310 is connected directly to the frame element 312 at a first location 313. To this end, the plate has a plane and ring shaped first contact surface 310.3 connected, at said first location 313, to a first interface of the frame element 312 in the form of a plane and ring shaped second contact surface 312.2. Both, the first contact surface 310.3 and the second contact surface 312.2 are parallel to the first plane 310.2 of the plate 310. Thus, the second contact surface 312.2 matches the first contact surface 310.3 to provide a wide contact area 313.1.

The first contact surface 310.3 and the second contact surface 312.2 define the contact area 313.1. The contact area 313.1 extends over the entire circumference of the plate 310. Furthermore, the contact area 313.1 extends over about 20% of the radius of the plate 310, i.e. the dimension in a radial direction perpendicular to the first axis of symmetry 310.1 of the plate 310. Thus, a wide contact area 313.1 is formed, the area of which corresponds to about 38% of the area of the adjacent optical surface of the plate 310, the first contact surface 310.3 forms part of.

In this context, it will be appreciated that, with other embodiments of the invention, the first an second contact surface may be of any other shape. In particular, if the optical element is a lens or the like, the first and second contact surface may be matching curved surfaces, respectively.

With the direct connection between the plate 310 and the frame element 312 and the wide contact area 313.1 there is provided a maximum rigidity at the first interface between the plate 310 and the frame element 312 in the direction of the optical axis 3.2. This leads to favorable vibration characteristics of the assembly.

The plate 310 is bonded to the frame element 312 over their entire contact surface by low temperature bonding. To this end, preferably, in the contact area 313.1, the deviation between the surface figure of the plate 310 and the frame element 312 is less than 3 µm. In case a fusion bonding process or a similar other connecting process is chosen, the deviation between the surface figure of the plate 310 and the frame element 312 is less than 0.3 µm. Thus, a gas tight and liquid tight connection is formed between the plate 310 and the frame element 312.

This gas and liquid tight connection prevents the ingress of contaminants, such as liquid or gaseous fractions of the immersion medium etc., into the interior part 3.7 of the optical element unit 3 via the interface area between the plate 310 and the frame element 312. Such contaminants could deposit on the lenses and adversely affect the imaging properties of the optical element group 7.

The plate 310 is made of calcium fluoride ($CaF_2$), said calcium fluoride having a first coefficient of thermal expansion. The frame element 312, in turn, is made of a stainless steel material having a second coefficient of thermal expansion. The second coefficient of thermal expansion of the stainless steel material used for the frame element 312 is adapted to the first coefficient of thermal expansion of the plate 310 such as to be substantially equal to said first coefficient of thermal expansion. The adaptation has been provided as it has been described above in the context of the first embodiment.

This provides for matching thermal expansion properties at the interface area between the plate 310 and the frame element 312. It makes it possible to have the direct fluid tight connection between the plate 310 and the frame element 312 without the risk of any harm to the connection by relative movements between the plate 310 and the frame element 312 due to different thermal expansion properties.

At a second location 314, remote from the first location 313, the frame element 312 is connected via a second interface 312.3 in a fluid tight manner to a support element in the form of a housing module 315 of the last optical element module 303.5.

The second location 314 is located at a first distance from the first location 313 which is sufficiently large such that stresses introduced into the frame element 312 at the second location 314 are taken and substantially relieved within the frame element 312 such that, if any, only a small amount of such stresses is introduced into the plate 310 at the first location 313. Thus, the stresses introduced into the plate 310 and, thus, deformations of the plate 310 resulting from such stresses are reduced with the invention.

To reduce the stresses introduced into the frame element 312, the frame element 312 is connected to the housing module 315 via deformation uncoupling elements in the form of leaf springs 318 evenly distributed at the outer circumference of the frame element 312. However, it will be appreciated that, with other embodiments of the invention any other type of suitable deformation uncoupling element may be selected.

These deformation uncoupling elements 318 provide a deformation uncoupling between the housing module 315 and the unit formed by the frame element 312 and the plate 310. Due to the distance between the first location 313 and the second location 314, the deformation uncoupling elements 318 may have a cross section in a second plane parallel to the first plane 310.2 which is sufficiently large to provide favourable rigidity properties in the direction of the optical axis 3.2.

The deformation uncoupling elements 318 may be connected to the housing module 315 and the frame element 312, respectively, in any suitable manner. For example, the connection may be provided by screws, bolts, clamping elements etc. or combinations thereof.

The necessary distance between the first and second location and the length and cross section of the deformation uncoupling elements 318 in order to achieve the above stress relief depends on the material and the geometry of the frame element. Thus, in turn, at given spatial boundaries, the geometry of the frame element may be selected as a function of the stress relief to be achieved.

Although the material of the housing module 315 might also be the same as the material of the frame element 312, in the embodiment shown, the material of the housing module 315 is a steel material. In particular, the material of the housing module 315 has a third coefficient of thermal expansion which is different from the second coefficient of thermal expansion. Thus, at the interface between the housing module 315 and the frame element 312, considerable stresses may occur due to these different coefficients of thermal expansion. However, the materials used for both components are of sufficient strength to take these stresses.

The components of the penultimate optical element module 3.4, apart from the penultimate lens 9, are made of the same material as the housing module 315, Thus, as a consequence of the different coefficients of thermal expansion within the last optical element module 303.5 and the stresses resulting therefrom, relative motion between the last optical element module 303.5 and the penultimate optical element module 3.4 might occur at their interface. To avoid such relative motion, a sufficiently strong connection between the penultimate optical element module 3.4 and the last optical element module 303.5 is provided.

In order to prevent the ingress of contaminants, such as liquid or gaseous fractions of the immersion medium etc., into the interior part 3.7 of the optical element unit 3 via the gap between the frame element 312 and the housing module 315, a sealing device in the form of a bellows 319 is provided between the frame element 312 and the housing module 315.

It will be appreciated that the optical element unit 303 of FIG. 6 may as well be manufactured with a method according to the invention as it has been described above with reference to FIG. 3.

Fifth Embodiment

In the following, a fifth preferred embodiment of an optical element module 403.4 according to the invention will be described with reference to FIGS. 1 and 7. In this embodiment, the optical element module 403.4 replaces the optical element module 3.4 within the exposure apparatus 1 of FIG. 1.

Figure 7:
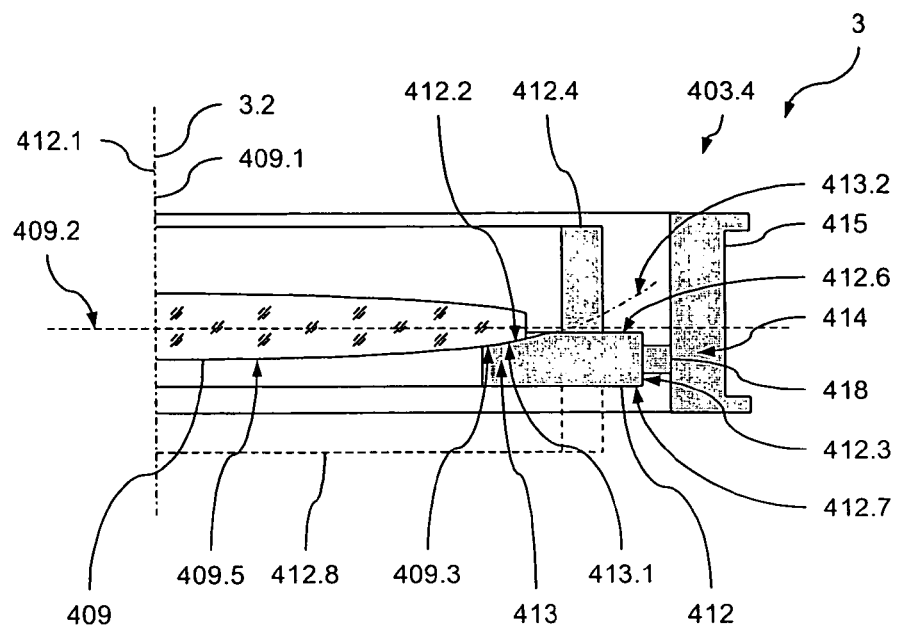
FIG. 7 is a schematic partial sectional representation of a further preferred embodiment of an optical element module according to the invention used in the optical exposure apparatus of FIG. 1.

FIG. 7 shows a schematic partial sectional representation of the penultimate optical element module 403.4 of the optical element unit 3. As can be seen from FIG. 7, the penultimate optical element module 403.4 comprises an penultimate optical element in the form of a lens 409 and an optical element holder 412 holding the lens 409.

The lens 409 is rotationally symmetric having a first axis of symmetry 409.1 essentially coinciding with the optical axis 3.2 of the optical element unit 3. The lens 409 mainly extends in a first plane 409.2 perpendicular to said first axis of symmetry 409.1.

The optical element holder is formed by a ring shaped frame element 412 having a second axis of symmetry 412.1, which—in the situation shown in FIG. 7—essentially coincides with the first axis of symmetry 409.1 of the lens 409. The frame element 412 extends in a circumferential direction of the lens 409 in a second plane perpendicular to said second axis of symmetry 412.1 and parallel to said first plane 409.2.

The lens 409 is connected directly to the frame element 412 at a first location 413. To this end, the lens has a curved and ring shaped first contact surface 409.3 connected, at said first location 413, to a first interface of the frame element 412 in the form of a curved and ring shaped second contact surface 412.2. The first contact surface 409.3 and the second contact surface 412.2 define the contact area 413.1 between the lens 409 and the frame element 412. The first contact surface 409.3 is a part of the first optical surface 409.5 of the lens 409.

Both, the first contact surface 409.3 and the second contact surface 412.2, at any point of the contact area 413.1, have substantially the same curvature in any sectional plane including the axis 409.1. In other words, the second contact surface 412.2 matches the first contact surface 409.3 to provide a wide contact area 413.1.

The contact area 413.1 extends over the entire circumference of the lens 409. However, it will be appreciated that, with other embodiments of the invention, the contact area may be interrupted one or several times in the circumferential direction, e.g. by radial slots in the frame element, i.e. the optical element holder, to provide one or more contact sections forming the contact area. For example there may be three radial slots in the frame element, i.e. the optical element holder, to provide three contact sections forming the contact area. Such a configuration may be useful if it is necessary to provide a support situation to some extent approximated to an isostatic three point support. Preferably, such radial slots, at least in the region of the contact area, completely reach through the frame element in the direction of the axis of the optical element in order to enhance deformation uncoupling if necessary.

Furthermore, the contact area 413.1 extends over about 12% of the radius of the lens 409, i.e. the dimension in a radial direction perpendicular to the first axis of symmetry 409.1 of the lens 409. Thus, a wide contact area 413.1 is formed, the area of which corresponds to about 20% of the area of the adjacent optical surface of the lens 409, the first contact surface 409.3 forms part of.

With the direct connection between the lens 409 and the frame element 412 and the wide contact area 413.1 there is provided a maximum rigidity at the first interface between the lens 409 and the frame element 412 in the direction of the optical axis 3.2. This leads to favorable vibration characteristics of the assembly.

In the contact area 413.1 the lens 409 and the frame element 412 both have an average thickness—i.e. a dimension along the optical axis 3.2—that is approximately the same leading to a axial rigidity of the arrangement that is eight times the one of the lens 409. Preferably, in the contact area, the average thickness of the frame element is at least 25% of the average thickness of the lens such that at least twice the axial rigidity of the lens is obtained. Thus, a very rigid arrangement is already obtained by this means.

It will be appreciated that the rigidity of the assembly formed by the lens 409 and the frame element 412 in the direction of the optical axis 3.2 is further enhanced according to the invention by mounting a stiffening element 412.4 to the frame element 412. The stiffening element 412.4 has the form of a hollow cylinder. It is mounted to the first face 412.6 of the frame element 412 facing in the direction of the lens 409. The stiffening element 412.4 is connected to the frame element 412 by any suitable connecting technique providing a long term stable and rigid connection as will be explained in further detail below. In particular, the stiffening element may be connected to the frame element by bonding, adhesive bonding, soldering, clamping, screwing and any combination thereof.

The stiffening element 412.4, in a direction parallel to the axis 409.1, reaches beyond the lens 409. Thus, the stiffening element 412.4 provides a considerable contribution to the rigidity of the assembly, in particular to the rigidity in the direction of the axis 409.1. Preferably, the stiffening element 412.4 reaches as far as possible beyond the lens 409, e.g. until it nearly contacts an adjacent component of the optical element unit 3.

It will be appreciated that the stiffening element does not necessarily have to be a circumferentially closed hollow cylinder. Thus, with other embodiments of the invention, the stiffening element may also be formed by a plurality wall segments, e.g. hollow cylinder segments, evenly distributed at the circumference of the frame element. Furthermore, it will be appreciated that, with other embodiments of the invention, the stiffening element may also be omitted.

The frame element 412 is manufactured such that, in a direction parallel to the axis 409.1 and directed from the frame element 412 towards the lens 409, it does neither reach beyond the lens 409 nor beyond the—imaginary—surface 413.2. The surface 413.2 is defining the second contact surface 412.2 and is a continuation of this second contact surface 412.2. The surface 413.2 corresponds, for example, to the outer surface of a tool which may be used to manufacture the second contact surface 412.2.

This modular design has several advantages. One advantage is that, due to the fact that the frame element 412 does not reach beyond the lens 409, a simple annular body of small dimensions in the direction of the axis 409.1 results with an easily accessible second contact surface 412.2. The frame element 412, due to its simple design, may be manufactured with few loss of material. Thus, it allows an economical use of costly materials for the frame element 412 as well.

Furthermore, due to the fact that the frame element 412 does not reach beyond the surface 413.2, manufacture of the second contact surface 412.2 is further facilitated while, at the same time allowing the manufacture of a high precision second contact surface 412.2. This is due to the fact that a simple but high precision tool may be used to manufacture the second contact surface 412.2. Thus, a manufacturing precision may be achieved for the second contact surface 412.2 that is in the order of the manufacturing precision of the first contact surface 409.3 of the lens 409. Thus a high precision match may be achieved in the contact area 413.1 leading to a highly rigid connection in the contact area 413.1.

The modular design with the separate stiffening element 412.4 provides the further advantage that a highly rigid configuration may be achieved with parts that may be easily manufactured and connected.

It will be further appreciated that the rigidity of the assembly formed by the lens 409 and the frame element 412 in the direction of the optical axis 3.2 may be further enhanced according to the invention by mounting a second stiffening element in the form of a hollow cylinder to the second face 412.7 of the frame element 412 facing away from the lens 409 as it is indicated by the dashed contour 412.8 in FIG. 7.

The lens 409 is made of a first calcium fluoride ($CaF_2$) material, said calcium fluoride material having a first coefficient of thermal expansion. The frame element 412, in turn, is made of a second calcium fluoride ($CaF_2$) material as well, said second calcium fluoride material having a second coefficient of thermal expansion. Since both materials are calcium fluoride materials, the second coefficient of thermal expansion used for the frame element 412 is highly adapted to the first coefficient of thermal expansion of the lens 409 such as to be substantially equal to said first coefficient of thermal expansion.

To further reduce any possible deviations between the first coefficient of thermal expansion and the second coefficient of thermal expansion, first calcium fluoride material and the second calcium fluoride material may be taken from the same batch. However, since material of the frame element 412 does not have to provide any optical functions, less effort has to be taken in further processing the material. Thus, preferably, in order to keep the costs low, the second calcium fluoride ($CaF_2$) material may have optical properties that are inferior, even way inferior, to the optical properties of the first calcium fluoride ($CaF_2$) material.

It will be appreciated that, with the use of a (refractive) optical element material for the frame element 412, as explained above, high precision manufacturing techniques used for manufacturing optical elements may be used for manufacturing the frame element 412, in particular the second contact surface 412.2. This leads to an improved surface precision for the second contact surface 412.2 and, thus, to improved contact conditions at the contact area 413.1. As mentioned above, the simple but rigid modular design with parts that may be manufactured with few loss of material allows an economical use of such costly optical element materials for the frame element 412.

Since it is of very simple design that may be manufactured with few loss of material as well, the stiffening element 412.4 may be made of such an optical element material as well. Thus, in the present embodiment, the stiffening element 412.4 is made of a calcium fluoride material as well.

However, it will be appreciated that, with other embodiments of the invention, other optical element materials, e.g. quartz ($SiO_2$), may be used for the frame element and the stiffening element. Furthermore, the materials used for the frame element and the stiffening element may be different from each other.

In particular, in a situation where the coefficient of thermal expansion of the frame element deviates from the coefficient of thermal expansion of the optical element, the coefficient of thermal expansion, the location and the shape of the stiffening element may be selected such that the deviation in the thermally induced expansion properties between the stiffening element and the frame element introduces a deformation into the frame element that counteracts a deformation introduced into the optical element due to the deviation in the thermally induced expansion properties between the optical element and the frame element. For example, with the geometry shown in FIG. 7 and the coefficient of thermal expansion of the lens being smaller than the coefficient of thermal expansion of the frame element, the coefficient of thermal expansion of the stiffening element may be selected to be slightly higher than the coefficient of thermal expansion of the frame element to introduce, upon thermal expansion, the above counteracting deformation into the frame element.

The lens 409 is bonded to the frame element 412 over their entire contact surface by low temperature bonding at a temperature above 500° C., preferably slightly above 900° C. Thus, with the highly conforming first and second contact surfaces 409.3 and 412.2, a tight connection is formed between the lens 409 and the frame element 412. The same applies for the connection between the stiffening element 412.4 and the frame element 412. In particular, all three parts may be connected in one single step.

At a second location 414, remote from the first location 413, the frame element 412 is connected via a second interface 412.3 to a support element in the form of a housing module 415 of the penultimate optical element module 403.4.

The second location 414 is located at a first distance from the first location 413 which is sufficiently large such that stresses introduced into the frame element 412 at the second location 414 are taken and substantially relieved within the frame element 412 such that, if any, only a small amount of such stresses is introduced into the lens 409 at the first location 413. Thus, the stresses introduced into the lens 409 and, thus, deformations of the lens 409 resulting from such stresses are reduced with the invention.

To reduce the stresses introduced into the frame element 412, the frame element 412 is connected to the housing module 415 via suitable deformation uncoupling elements 418 evenly distributed at the outer circumference of the frame element 412.

These deformation uncoupling elements 418 provide a deformation uncoupling between the housing module 415 and the unit formed by the frame element 412 and the lens 409. Due to the distance between the first location 413 and the second location 414, the deformation uncoupling elements 418 may have a cross section in a second plane parallel to the first plane 409.2 which is sufficiently large to provide favourable rigidity properties in the direction of the optical axis 3.2.

Although the material of the housing module 415 might also be the same as the material of the frame element 412, in the embodiment shown, the material of the housing module 415 is a steel material. In particular, the material of the housing module 415 has a coefficient of thermal expansion which is different from the second coefficient of thermal expansion. Thus, at the interface between the housing module 415 and the frame element 412, considerable stresses may occur due to these different coefficients of thermal expansion. However, the materials used for both components are of sufficient strength to take these stresses.

It will be appreciated that the optical element unit 403.4 of FIG. 7 may as well be manufactured with a method according to the invention similar to the one as it has been described above with reference to FIG. 3.

Sixth Embodiment

In the following, a sixth preferred embodiment of an optical element module 503.4 according to the invention will be described with reference to FIGS. 1 and 8. In this embodiment, the optical element module 503.4 replaces the optical element module 3.4 within the exposure apparatus 1 of FIG. 1.

Figure 8:
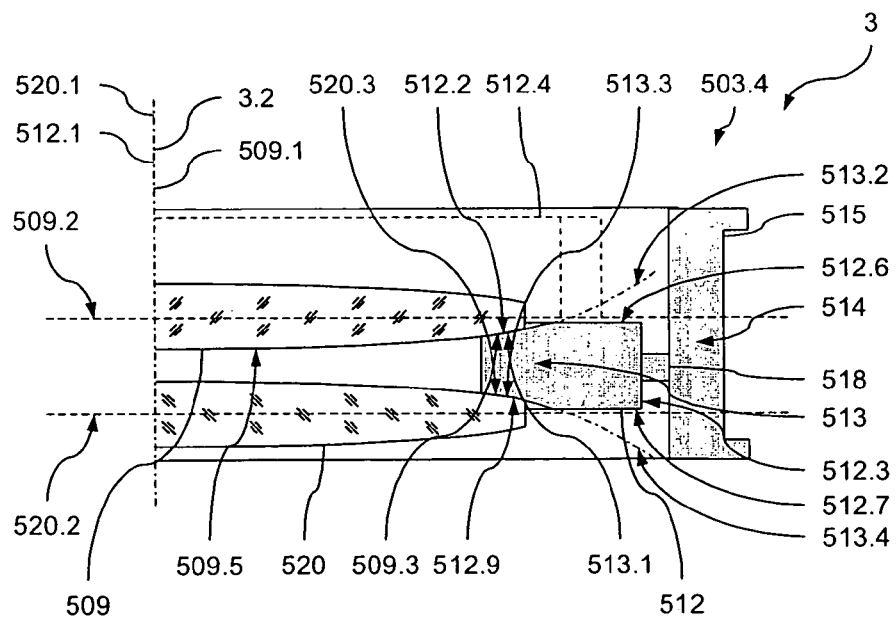
FIG. 8 is a schematic partial sectional representation of a further preferred embodiment of an optical element module according to the invention used in the optical exposure apparatus of FIG. 1.

FIG. 8 shows a schematic partial sectional representation of the penultimate optical element module 503.4 of the optical element unit 3. As can be seen from FIG. 8, the penultimate optical element module 503.4 comprises two optical elements in the form of a first lens 509 and a second lens 520 and an optical element holder 512 holding the lenses 509 and 520 at opposite faces, respectively.

The lenses 509 and 520 are rotationally symmetric having a first axis of symmetry 509.1 and 520.1 essentially coinciding with the optical axis 3.2 of the optical element unit 3. Each of the lenses 509 and 520 mainly extends in a first plane 509.2 and 520.2, respectively, perpendicular to said first axis of symmetry 509.1 and 520.1.

The optical element holder is formed by a ring shaped frame element 512 having a second axis of symmetry 512.1, which—in the situation shown in FIG. 7—essentially coincides with the respective first axis of symmetry 509.1 and 520.1 of the lens 509 and 520, respectively. The frame element 512 extends in a circumferential direction of the lenses 509 and 520 in a second plane perpendicular to said second axis of symmetry 512.1 and parallel to said first plane 509.2 and 520.2, respectively.

The respective lens 509 and 520 is connected directly to the frame element 512 at a first location 513. To this end, the first lens 509 has a curved and ring shaped first contact surface 509.3 connected, at said first location 513, to a first interface of the frame element 512 in the form of a curved and ring shaped second contact surface 512.2. The first contact surface 509.3 and the second contact surface 512.2 define the first contact area 513.1 between the first lens 509 and the frame element 512. The first contact surface 509.3 is a part of the first optical surface 509.5 of the lens 509.

Both, the first contact surface 509.3 and the second contact surface 512.2, at any point of the contact area 513.1, have substantially the same curvature in any sectional plane including the axis 509.1. In other words, the second contact surface 512.2 matches the first contact surface 509.3 to provide a wide contact area 513.1.

Similarly, the second lens 520 has a curved and ring shaped third contact surface 520.3 connected, at said first location 513, to a further first interface of the frame element 512 in the form of a curved and ring shaped fourth contact surface 512.9. The third contact surface 520.3 and the fourth contact surface 512.9 define the second contact area 513.3 between the second lens 520 and the frame element 512. The third contact surface 520.3 is a part of the optical surface 520.5 of the lens 520.

Both, the third contact surface 520.3 and the fourth contact surface 512.9, at any point of the second contact area 513.3, have substantially the same curvature in any sectional plane including the axis 520.1. In other words, the fourth contact surface 512.9 matches the third contact surface 520.3 to provide a wide contact area 513.3.

The respective contact area 513.1 and 513.3 extends over the entire circumference of the respective lens 509 and 520. However, it will be appreciated that, with other embodiments of the invention, the contact area may be interrupted one or several times in the circumferential direction as it has been explained above in the context of the fifth embodiment.

The first contact surface 509.3 and third contact surface 520.3 are designed and manufactured in a manner as it has been explained above for the first contact surface 409.3 in the context of the fifth embodiment. Similarly, the second contact surface 512.2 and the fourth contact surface 512.9 are designed and manufactured in a manner as it has been explained above for the second contact surface 412.2 in the context of the fifth embodiment. Furthermore the connection between the first lens 509 and the frame element 512 as well as the connection between the second lens 520 and the frame element 512 is designed and manufactured in a manner as it has been explained above for the first lens 409 in the context of the fifth embodiment. Thus, with respect to the properties and advantages of this design it is here referred mainly to the above explanations.

In particular, the frame element 512 is manufactured such that, in a direction parallel to the axis 509.1 and directed from the frame element 512 towards the respective lens 509 and 520, it does neither reach beyond the respective lens 509 and 520 nor beyond the—imaginary—surface 513.2 and 513.4, respectively. The respective surface 513.2 and 513.4 is defining the second contact surface 512.2 and the fourth contact surface 512.9, respectively, and is a continuation of this second contact surface 512.2 and the fourth contact surface 512.9, respectively. The surfaces 513.2 and 513.4 correspond, for example, to the outer surface of a tool which may be used to manufacture the second contact surface 512.2 and the fourth contact surface 512.9, respectively.

With the direct connection between the respective lens 509 and 520 and the frame element 512 and the respective wide contact area 513.1 and 513.3 there is provided a maximum rigidity at the first interfaces between the lenses 509 and 520 and the frame element 512 in the direction of the optical axis 3.2. This leads to favorable vibration characteristics of the assembly.

The design with two lenses 509 and 520 mounted to opposite faces 512.6 and 512.7 of the frame element 512 already provides for good rigidity. It will be appreciated that the rigidity of the assembly formed by the lenses 509 and 520 and the frame element 512 in the direction of the optical axis 3.2 may be further enhanced according to the invention by mounting a stiffening element to the frame element 512 as it is indicated in FIG. 8 by the dashed contour 512.4. The design, manufacture, mounting and advantages of such a stiffening element have been explained above in the context of the fifth embodiment. Thus, it is here referred mainly to the above explanations.

The lenses 509 and 520 and the frame element 512 are made of a first calcium fluoride ($CaF_2$) material as it has been explained above for the first lens 409 and the frame element 412 in the context of the fifth embodiment. Thus, it is here referred mainly to the above explanations.

At a second location 514, remote from the first location 513, the frame element 512 is connected via a second interface 512.3 to a support element in the form of a housing module 515 of the penultimate optical element module 503.4. The second location 514 is located at a first distance from the first location 513 which is sufficiently large such that stresses introduced into the frame element 512 at the second location 514 are taken and substantially relieved within the frame element 512 such that, if any, only a small amount of such stresses is introduced into the lens 509 and 520 at the first location 513. Thus, the stresses introduced into the respective lens 509 and 520 and, thus, deformations of the lenses 509 and 520 resulting from such stresses are reduced with the invention.

To reduce the stresses introduced into the frame element 512, the frame element 512 is connected to the housing module 515 via suitable deformation uncoupling elements 518 evenly distributed at the outer circumference of the frame element 512 as it has been explained above for the uncoupling elements 418 in the context of the fifth embodiment.

Although the material of the housing module 515 might also be the same as the material of the frame element 512, in the embodiment shown, the material of the housing module 515 is a steel material. In particular, the material of the housing module 515 has a coefficient of thermal expansion which is different from the second coefficient of thermal expansion. Thus, at the interface between the housing module 515 and the frame element 512, considerable stresses may occur due to these different coefficients of thermal expansion. However, the materials used for both components are of sufficient strength to take these stresses.

It will be appreciated that the optical element unit 503.4 of FIG. 8 may as well be manufactured with a method according to the invention similar to the one as it has been described above with reference to FIG. 3.

Seventh Embodiment

In the following, a seventh preferred embodiment of an optical element module 603.4 according to the invention will be described with reference to FIGS. 1 and 9. In this embodiment, the optical element module 603.3 replaces the optical element module 3.3 and the optical element module 603.4 replaces the optical element module 3.4 within the exposure apparatus 1 of FIG. 1.

Figure 9:
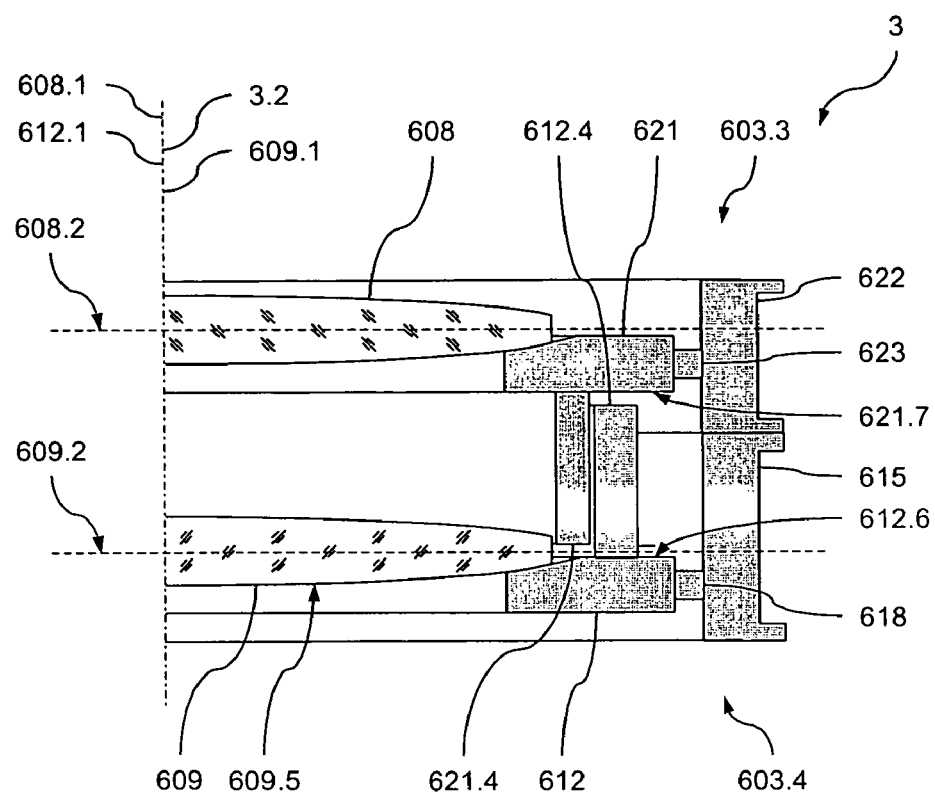
FIG. 9 is a schematic partial sectional representation of a further preferred embodiment of an optical element module according to the invention used in the optical exposure apparatus of FIG. 1.

FIG. 9 shows a schematic partial sectional representation of the optical element modules 603.3 and 603.4 of the optical element unit 3. As can be seen from FIG. 9, the penultimate optical element modules 603.3 and 603.4 comprise two optical elements in the form of a first lens 608 and a second lens 609 and two optical element holders 621 and 612 holding the lenses 608 and 609, respectively.

The lenses 608 and 609 are rotationally symmetric having a respective first axis of symmetry 608.1 and 609.1 essentially coinciding with the optical axis 3.2 of the optical element unit 3. Each of the lenses 608 and 609 mainly extends in a first plane 608.2 and 609.2, respectively, perpendicular to said first axis of symmetry 608.1 and 609.1, respectively.

The assemblies formed by the lenses 608 and 609 and the frame elements 621 and 612, respectively, are substantially identical to the assembly formed by the lens 409 and the frame element 412 as it has been explained above in the context of the fifth embodiment. Similarly, the respective frame element 521 and 512 is connected to the respective housing module 622 and 615 via suitable deformation uncoupling elements 623 and 618, respectively. These parts correspond to the housing module 415 the deformation uncoupling elements 418, respectively, as they have been explained above in the context of the fifth embodiment. Thus, with respect to the properties, manufacture, arrangement and advantages of these parts it is here referred mainly to the above explanations.

The design of the assemblies formed by the lenses 608 and 609 and the frame elements 621 and 612, respectively, already provides for good rigidity. It will be appreciated that the rigidity of these assemblies formed by the lenses 608 and 609 and the frame elements 621 and 612, respectively, in the direction of the optical axis 3.2 is further enhanced according to the invention by mounting a first stiffening element 621.4 to a face 621.7 of the first frame element 621 and a second stiffening element 612.4 to a face 612.6 of the second frame element 612, the face 612.6 facing towards the face 621.7. The design, manufacture, mounting and advantages of such a stiffening element have been explained above in the context of the fifth embodiment. Thus, it is here referred mainly to the above explanations.

The first stiffening element 621.4 is arranged concentrically with the second stiffening element 612.4. The first stiffening element 621.4 is formed by a hollow cylinder that almost reaches up to the face 612.6 of the second frame element 612. Similarly, the second stiffening element 612.4 is formed by a hollow cylinder that almost reaches up to the face 621.7 of the first frame element 621. The first stiffening element 621.4 is arranged concentrically with the second stiffening element 612.4. To this end, the first stiffening element 621.4 has an outer diameter that is slightly smaller than the inner diameter of the second stiffening element 612.4. Thus, the first stiffening element 621.4 and the second stiffening element 612.4 overlap in the direction of the axes 608.1 and 601.1, respectively, and form a telescope-like configuration. This overlap or telescope-like configuration allows to maximize the axial length of the respective stiffening element 621.4 and 612.4 and, as a consequence, to maximize their contribution to the rigidity of the respective assembly.

It will be appreciated that, with other embodiments of the invention, further stiffening elements may be mounted to the respective frame elements depending on the rigidity to be obtained for the respective assembly.

It will be further appreciated that the optical element unit 603.4 of FIG. 8 may as well be manufactured with a method according to the invention similar to the one as it has been described above with reference to FIG. 3.

Although, in the foregoing, embodiments of the present invention have been described where the frame element has a circular shape, it will be appreciated that, with other embodiments of the present invention, the frame element may have any other shape, e.g. polygonal shape, in particular a rectangular shape to form a rectangular frame element.

The same applies for the optical element. This one as well may have any suitable shape in its first plane. For example, the optical element of FIG. 2 may be a rectangular plate having a rectangular cross section in its first plane held by a frame having a rectangular cross section in said first plane.

Furthermore, the present invention has been described in the context of embodiments where refractive optical elements such as lenses and plane parallel plates are held by respective optical element holders. However, it will be appreciated that, with other embodiments of the present invention, other types of optical elements, such as reflective and/or diffractive optical elements, e.g. mirrors or gratings or the like, may be held by a corresponding optical element holder as it has been described above.

Furthermore, the present invention has been described in the context of embodiments where an immersion zone is provided. However, it will be appreciated that, with other embodiments of the present invention, such an immersion zone may be omitted.

Furthermore, the present invention has been described in the context of embodiments for optical exposure processes. However, it will be appreciated that the invention may also be used in the context of any other optical application, where a relief of an optical element from stresses resulting from thermal expansion in the region of the respective optical element is required.

What is claimed is:

1. An optical element module comprising:
a first optical element and
an optical element holder;
said first optical element having a first coefficient of thermal expansion;
said optical element holder holding said optical element and having a second coefficient of thermal expansion, said second coefficient of thermal expansion being adapted to said first coefficient of thermal expansion;
said first optical element directly contacting said optical element holder in a wide contact area,
said contact area being defined by a first contact surface of said optical element and a second contact surface of said optical element holder, said second contact surface matching said first contact surface, wherein a deviation between said first contact surface and said second contact surface does not exceed 3 µm.

2. The optical element module according to claim 1, wherein
said first optical element mainly extends in a first plane and has a centrally located first axis perpendicular to said first plane, and
said first optical element has a radial extension in a radial direction perpendicular to said first axis and a circumference in a circumferential direction about said first axis;
said contact area having at least one of
a circumferential extension over an angle of at least 10° in said circumferential direction of said first optical element and
a radial extension over at least 2% of said radial extension of said first optical element in said radial direction and
an area of at least 2% of the area of an adjacent optical surface of said first optical element.

3. The optical element module according to claim 2, wherein said contact area extends along substantially the entire circumference of said first optical element.

4. The optical element module according to claim 1, wherein
said first optical element mainly extends in a first plane and has a centrally located first axis perpendicular to said first plane, and
said optical element holder, in a direction parallel to said first axis and directed from said optical element holder towards said first optical element, does not reach beyond at least one of
said first optical element and
a surface defining said second contact surface and being a continuation of said second contact surface.

5. The optical element module according to claim 1, wherein
said first optical element mainly extends in a first plane and has a centrally located first axis perpendicular to said first plane;
said first optical element, in said contact area, having a first thickness in the direction of said first axis;
said optical element holder, in said contact area, having a second thickness in the direction of said first axis;
said second thickness being at least 25% of said first thickness.

6. The optical element module according to claim 1, wherein said first optical element mainly extends in a first plane and has a centrally located first axis perpendicular to said first plane, at least one stiffening element is mounted to said optical element holder;

said stiffening element extending in a direction parallel to said first axis.

7. The optical element module according to claim 6, wherein said stiffening element has the general shape of a hollow cylinder.

8. The optical element module according to claim 6, wherein said stiffening element, in a direction parallel to said first axis, extends beyond said first optical element.

9. The optical element module according to claim 6, wherein said optical element holder has a first face facing towards said first optical element and a second face facing away from said first optical element, at least one stiffening element being mounted to at least one of said first face and said second face.

10. The optical element module according to claim 6, wherein said stiffening element has a third coefficient of thermal expansion;

said third coefficient of thermal expansion being adapted to said second coefficient of thermal expansion.

11. The optical element module according to claim 6, wherein, said stiffening element has a third coefficient of thermal expansion different from said second coefficient of thermal expansion;

the location of said stiffening element, the size of said stiffening element and said third coefficient of thermal expansion being adapted to introduce a thermally induced first deformation into said optical element holder;

said thermally induced first deformation counteracting a thermally induced second deformation introduced into said first optical element via said optical element holder due to a difference in said first coefficient of thermal expansion and said second coefficient of thermal expansion.

12. The optical element module according to claim 6, wherein said stiffening element is made of the same material as said optical element holder.

13. The optical element module according to claim 6, wherein said stiffening element is connected to said optical element holder by a technique of joining parts from a group of techniques of joining parts consisting of bonding, adhesive bonding, soldering, clamping, screwing and any combination thereof.

14. The optical element module according to claim 1, wherein said optical element holder has a first face facing towards said first optical element and a second face facing away from said first optical element, and a second optical element is provided, said second optical element being mounted to said second face.

15. The optical element module according to claim 14, wherein said second optical element is mounted to said optical element holder in the manner of said first optical element.

16. The optical element module according to claim 1, wherein said second coefficient of thermal expansion is selected at least as a function of a temperature profile within said optical element module to be expected at least during normal operation of said optical element module.

17. The optical element module according to claim 1, wherein said second coefficient of thermal expansion is substantially equal to said first coefficient of thermal expansion.

18. The optical element module according to claim 1, wherein a difference between said first coefficient of thermal expansion and said second coefficient of thermal expansion is less than $10^{-6} K^{-1}$.

19. The optical element module according to claim 1, wherein the optical element holder is made of a material from a material group consisting of metals, metal alloys, ceramics, glass and any combination thereof.

20. The optical element module according to claim 1, wherein said first optical element is made of quartz ($SiO_2$) and said optical element holder is made of Invar.

21. The optical element module according to claim 1, wherein said first optical element is made of calcium fluoride ($CaF_2$) and said optical element holder is made of a material from a material group consisting of stainless steel and brass.

22. The optical element module according to claim 21, wherein said optical element holder is made of a steel material and the second coefficient of thermal expansion is adapted to said first coefficient of thermal expansion by a fraction of at least one component of said steel material selected as a function of said first coefficient of thermal expansion;

said at least one component being one of a group consisting of manganese (Mn), nickel (Ni), carbon (C), silicon (Si), chromium (Cr) and aluminum (Al).

23. The optical element module according to claim 1, wherein said first optical element is made of a first material and said optical element holder is made of a second material;

said first material and said second material being at least of the same material type.

24. The optical element module according to claim 23, wherein said second material has optical properties that are inferior to the optical properties of said first material.

25. The optical element module according to claim 23, wherein said first material and said second material are materials of a material group consisting of quartz ($SiO_2$) and calcium fluoride ($CaF_2$).

26. The optical element module according to claim 23, wherein said material of said first optical element and said material of said optical element holder are taken from the same batch.

27. The optical element module according to claim 1, wherein said first optical element is connected to said optical element holder by a technique of joining parts from a group of techniques of joining parts consisting of bonding, adhesive bonding, soldering, clamping and any combination thereof.

28. The optical element module according to claim 27, wherein the connection between said first optical element and said optical element holder excludes an organic adhesive.

29. The optical element module according to claim 1, wherein said optical element holder consists of a frame element directly connected to said first optical element.

30. The optical element module according to claim 1, wherein said optical element mainly extends in a first plane and said first contact surface is one of parallel to said first plane, perpendicular to said first plane and inclined to said first plane.

31. The optical element module according to claim 1, wherein said first contact surface is part of a surface optically used.

32. The optical element module according to claim 1, wherein said first optical element has a third contact surface and said optical element holder has a fourth contact surface directly contacting said third contact surface.

33. The optical element module according to claim 1, wherein said first optical element contacts said optical element holder at a first location;

a support device is provided, said support device supporting said optical element holder at a second location remote from said first location.

34. The optical element module according to claim 33, wherein said first location is situated at a first distance from said second location, said first distance being adapted to provide a reduction of stresses introduced into said first optical element by a relief of stresses introduced into said optical element holder at said second location.

35. The optical element module according to claim 33, wherein said support device is connected to said optical element holder via at least one deformation uncoupling element.

36. The optical element module according to claim 35, wherein said deformation uncoupling element comprises at least one leaf spring element.

37. The optical element module according to claim 34, wherein said optical element holder consists of a frame element, said frame element comprising a first interface located at said first location and directly connected to said first optical element, and said frame element comprising a second interface located at said second location and connected to said support device.

38. The optical element module according to claim 1, wherein said first optical element is connected to said optical element holder in a fluid tight manner.

* * * * *